United States Patent
Bertin et al.

(10) Patent No.: US 8,582,271 B2
(45) Date of Patent: Nov. 12, 2013

(54) OVER-VOLTAGE PROTECTION FOR POWER AND DATA APPLICATIONS

(75) Inventors: Jacques Bertin, Pocatello, ID (US); Luc D'Haeze, Orroir (BE)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/847,979

(22) Filed: Aug. 30, 2007

(65) Prior Publication Data

US 2008/0265984 A1 Oct. 30, 2008

(30) Foreign Application Priority Data

Aug. 31, 2006 (EP) .................................. 06447101
Feb. 1, 2007 (EP) .................................. 07002151

(51) Int. Cl.
*H02H 3/22* (2006.01)
*G05F 1/573* (2006.01)

(52) U.S. Cl.
USPC .......................................... 361/111; 323/277

(58) Field of Classification Search
USPC ......... 323/222, 225, 276, 277, 282, 284, 285, 323/288, 299, 303, 364, 368, 369, 370, 323/908; 307/25, 46; 361/93.1, 111; 713/300, 324, 340; 439/88, 181, 439/620.09, 620.13
See application file for complete search history.

(56) References Cited

U.S. PATENT DOCUMENTS

| | | | |
|---|---|---|---|
| 4,161,023 A * | 7/1979 | Goffeau ........................ | 363/124 |
| 5,122,724 A * | 6/1992 | Criss ............................. | 323/222 |
| 5,350,997 A * | 9/1994 | Ghotbi et al. ................. | 323/268 |
| 5,838,145 A | 11/1998 | Poon et al. | |
| 5,943,226 A | 8/1999 | Kim | |
| 6,008,549 A * | 12/1999 | Cooper et al. ................ | 307/125 |
| 6,028,465 A | 2/2000 | So | |
| 6,068,400 A * | 5/2000 | Nelson et al. ................. | 374/179 |
| 6,129,569 A | 10/2000 | Fernandez | |
| 6,184,659 B1 | 2/2001 | Darmawaskita | |
| 6,198,342 B1 | 3/2001 | Kawai | |
| 6,280,081 B1 | 8/2001 | Blau et al. | |
| 6,304,472 B1 | 10/2001 | Nagasu et al. | |
| 6,385,116 B2 | 5/2002 | Wang | |
| 6,456,044 B1 | 9/2002 | Darmawaskita | |
| 6,480,057 B2 | 11/2002 | Ogura | |
| 6,535,983 B1 | 3/2003 | McCormack et al. | |

(Continued)

OTHER PUBLICATIONS

Jean Picard, Electrical Transient Immunity for Power-Over-Ethernet, Texas Instruments Application Report, SLVA233A—Apr. 2006—Revised Aug. 2006, pp. 1-20.*

(Continued)

*Primary Examiner* — Adolf Berhane
*Assistant Examiner* — Emily Pham
(74) *Attorney, Agent, or Firm* — Sterne, Kessler, Goldstein & Fox P.L.L.C.

(57) ABSTRACT

A power supply device is described comprising a DC voltage supply, a power section connected to the DC supply for supplying DC power from the DC voltage supply to first and second outlet ports for connection to a remote device via a cable connection, a voltage boosting circuit for generating a voltage above that of the DC supply, an energy absorbing circuit connected between an output of the voltage boosting circuit and a ground potential, and a diode connection means between the first outlet port and the energy absorbing circuit. The major components of the power supply device may be implemented as an integrated circuit.

16 Claims, 3 Drawing Sheets

(56) References Cited

U.S. PATENT DOCUMENTS

| | | | |
|---|---|---|---|
| 6,548,993 B1 * | 4/2003 | Rutyna et al. | 323/288 |
| 6,646,842 B2 * | 11/2003 | Pan et al. | 361/58 |
| 6,703,889 B2 * | 3/2004 | Dodson, III | 327/434 |
| 6,734,717 B2 | 5/2004 | Min | |
| 6,770,938 B1 | 8/2004 | Fliesler et al. | |
| 6,790,097 B1 | 9/2004 | Edwards et al. | |
| 6,798,177 B1 | 9/2004 | Liu et al. | |
| 6,891,425 B1 * | 5/2005 | Huynh | 327/427 |
| 6,924,963 B2 | 8/2005 | Young et al. | |
| 6,936,994 B1 * | 8/2005 | Gimlan | 320/101 |
| 6,937,454 B2 * | 8/2005 | Mikolajczak et al. | 361/111 |
| 6,940,737 B2 | 9/2005 | Nakazawa et al. | |
| 6,960,949 B2 | 11/2005 | Suzuki | |
| 7,005,855 B2 * | 2/2006 | Zhu et al. | 324/380 |
| 7,012,413 B1 * | 3/2006 | Ye | 323/284 |
| 7,050,315 B2 | 5/2006 | Itoh | |
| 7,098,510 B2 | 8/2006 | Kodama et al. | |
| 7,248,025 B2 * | 7/2007 | Adachi | 323/273 |
| 7,281,141 B2 | 10/2007 | Elkayam et al. | |
| 7,368,894 B2 * | 5/2008 | Wong et al. | 323/222 |
| 7,417,877 B2 | 8/2008 | Leung et al. | |
| 7,492,108 B2 | 2/2009 | Garcia et al. | |
| 7,528,807 B2 * | 5/2009 | Kim et al. | 345/76 |
| 7,598,717 B2 * | 10/2009 | O'Meara | 323/283 |
| 2003/0099076 A1 | 5/2003 | Elkayam et al. | |
| 2003/0155963 A1 | 8/2003 | Huang | |
| 2004/0164619 A1 | 8/2004 | Parker et al. | |
| 2004/0201931 A1 | 10/2004 | Korcharz et al. | |
| 2004/0257743 A1 | 12/2004 | Chen et al. | |
| 2005/0052170 A1 | 3/2005 | Kim et al. | |
| 2005/0088160 A1 * | 4/2005 | Tanaka et al. | 323/284 |
| 2005/0162202 A1 | 7/2005 | Suzuki | |
| 2006/0012348 A1 * | 1/2006 | Zhao et al. | 323/259 |
| 2006/0092000 A1 | 5/2006 | Karam et al. | |
| 2006/0112285 A1 | 5/2006 | Stineman | |
| 2006/0132220 A1 | 6/2006 | Lee | |
| 2006/0164775 A1 | 7/2006 | Stineman et al. | |
| 2006/0173581 A1 | 8/2006 | Elkayam et al. | |
| 2006/0215343 A1 | 9/2006 | Camagna et al. | |
| 2006/0251188 A1 * | 11/2006 | Crawley et al. | 375/319 |
| 2007/0165345 A1 | 7/2007 | Woo | |
| 2007/0165548 A1 | 7/2007 | Woo | |
| 2007/0170909 A1 | 7/2007 | Vorenkamp et al. | |
| 2007/0189495 A1 * | 8/2007 | Crawley et al. | 379/323 |
| 2007/0206774 A1 | 9/2007 | Vorenkamp et al. | |
| 2008/0040625 A1 | 2/2008 | Vorenkamp et al. | |

OTHER PUBLICATIONS

Mendelson, G., "All You Need to Know About Power over Ethernet (PoE) and the IEEE 802.3af Standard," Internet Citation, [Online] Jun. 2004, XP002372480 Retrieved from the Internet: <URL:http://www.powerdsine.com/Documentation/WhitePapers/PoE_and_IEEE802_3af.pdf>.

*802.3af™, IEEE Standard for Information Technology—Telecommunications and information exchange between systems—Local and metropolitan area networks—Specific requirements, Part 3: Carrier Sense Multiple Access with Collision Detection (CSMA/CD) Access Method and Physical Layer Specifications, Amendment: Data Terminal Equipment (DTE) Power via Media Dependent Interface (MDI)*, IEEE Computer Society, IEEE, New York, NY, ISBN 0-7381-3696-4 (SH95132) (Print), ISBN 0-7381-3697-2 (SS95132) (PDF), Jun. 18, 2003, pp. i-ix and 1-121 (133 pages total).

International Search Report mailed Jul. 18, 2007 for PCT/US2007/001119, Filed Jan. 17, 2007, 3 pages.

* cited by examiner

OVER-VOLTAGE PROTECTION FOR POWER AND DATA APPLICATIONS

CROSS-REFERENCE TO RELATED APPLICATIONS

This patent application claims the benefit of European patent application serial number 07002151.4, filed Feb. 1, 2007 and European patent application serial number 06447101.4, filed Aug. 31, 2006, which patent applications are incorporated herein by reference in their entirety.

FIELD OF THE INVENTION

The present invention relates to methods and apparatus for supplying power over cables or wires to other electronic components to be powered, e.g. methods and apparatus for supplying power over a shared resource network such as an Ethernet network to other network components such as hubs, switches, routers, wireless base stations, wireless outlets, wireless access points, printer servers, PBX's as well as to other peripheral equipment such as data units, digital terminal equipment, telephones, computers, PDA's, displays, projectors, printers.

DESCRIPTION OF THE RELATED ART

Power over Ethernet (PoE) is the ability for LAN (Local Area Network) switching infrastructures to provide power over a copper Ethernet cable to an endpoint known as Powered Device. This capability, once referred to as "inline power," was originally developed and first delivered by known providers of Ethernet solutions in 2000 to support the emerging IP Telephony deployments. IP Telephones, like desktop PBX phones, need power for their operation and Power over Ethernet enables scalable and manageable power delivery and simplifies deployments of IP Telephony. As Wireless networking emerged, Power over Ethernet was also used to power these devices to allow for deployments in locations where local power access did not exist. While IP telephones and wireless access points are the most intuitive uses for PoE, the advent of 802.3af standardization of PoE opens the door to a new generation of networked-attached devices such as video cameras, point-of-sale devices, security access control (card scanners), building automation and industrial automation just to name a few. It is desirable for such applications to minimize downtime. Therefore, it is desirable to increase the robustness of the hardware to environmental hazards like electrostatic discharge (ESD) or induced over-voltages and cable discharge events (CDE).

A cable discharge event will strike LAN equipment in general and PoE equipment in particular when a charged cable is connected to an Ethernet port of that equipment that is at a different, e.g. lower, potential. The ensuing high energy discharge may damage among other things the connector, the Ethernet transceiver as well as any integrated circuit interface in the path of the discharge. Charge accumulates on cables primarily through triboelectric effects, e.g. the friction on a carpet, in a cable conduit or even in air will result in accumulated charge, or induction. Induction effects can be observed when cables accumulate charge from adjacent electromagnetic fields, such as light ballasts. Newer types of cables have very low leakage and will retain charge for extended periods of time (24 hours and more). Current LAN networks can be used in very dynamic environments where a device will be connected and disconnected to a LAN several times a day thereby increasing the probability of CDE incidents at disconnections and reconnections. Emerging PoE applications more and more rely on longer cables between devices. Longer cables (up to 200 meters and more) have the capacity to store more charge which further increases the energy that the cable will be able to store. A typical cable discharge event will cause much higher current flow than typical electrostatic discharges, e.g. human body model, machine model or charged device model, because there is no resistance at the ESD source to limit the current. Furthermore, while an ESD pulse is usually fast and unipolar, the waveform of a cable discharge event is more complex, e.g. rapid polarity reversals, and may last for microseconds, milliseconds or even seconds.

Some known ESD protection solves the problem of discharges at the connector level, see, for example U.S. Pat. No. 6,790,097; U.S. Pat. No. 6,129,569 and US 2004/0257743.

In US 2006/0173581A1, a system is proposed where a bypass path under the control of a digital circuit may be activated by said circuit to allow an excess electric charge stored on a (parasitic) capacitor connected across the ports of a PoE device to be neutralized. Because of its reliance on a digital circuit, the proposed system is not well suited to protect the PoE device against erratic discharge events, in particular cable discharge events.

SUMMARY OF THE INVENTION

It is an object of the present invention to provide improved methods and apparatus for supplying power over cables or wires to other electronic components to be powered, e.g. methods and apparatus for supplying power over a shared resource network such as an Ethernet network to other network components such as hubs, switches, routers, wireless base stations, wireless outlets, wireless access points, printer servers, PBX's as well as to other peripheral equipment such as data units, digital terminal equipment, telephones, computers, PDA's, displays, projectors, printers.

An advantage of the present invention is that powered network elements and peripherals and power supply devices have an improved protection against electrical discharge activity such as CDE's.

The present invention provides:
a power supply device comprising:
a DC voltage supply (VDD);
a power section connected to the DC supply for supplying DC power from the DC voltage supply to first and second outlet ports for connection to a remote device via a cable connection;
an energy absorbing circuit connected between a second DC voltage (VDD2) and a ground potential; and
a diode connection means between the first outlet port and the second DC voltage (VDD2). In particular, the second voltage An advantage of the above device is that the protection against CDE's is better than if the energy absorbing circuit is connected directly across the outlets.

The device may include a mixed signal control section. The power section may include a power switch and a current sensing device. The power switch is preferably adapted to control the amount of current supplied to the first and second outlet ports based on an output from the current sensing device. This provides the advantage of good control of the current during normal operation.

The electric energy absorbing circuit can include a shorter term energy absorbing means and a longer term energy absorbing means. By having two different speeds of operation, the energy absorbing circuit can react appropriately despite the complex waveforms seen during a CDE.

Optionally, the shorter term energy absorbing means and/or the longer term energy absorbing means includes a capacitor. Capacitors are relatively easy to provide as external components to an integrated circuit. The shorter term energy absorbing means can include a first capacitor and the longer term energy absorbing means can include a second capacitor, the first and second capacitors are connected in parallel. By connecting in parallel, each capacitor will absorb its own portion of the discharge energy.

A diode may be connected between the first outlet and ground. This diode is reversed biased at normal operation and conducts current to ground if the voltage on the first outlet goes negative with respect to ground.

A diode may also be connected between VDD2 (e.g. the DC voltage output equal to the supply voltage or a boosted voltage output) and the second outlet. This diode is normally reverse biased and provides protection against a voltage rise on the second outlet. If this happens the current is diverted to the energy absorbing circuit through this diode.

The present invention also provides an electronic component comprising:

an input for connection to a DC supply, a power section connected to the DC supply for supplying DC power at a first DC voltage from the DC voltage supply to first and second outlet ports for connection to a remote device via a cable connection; and a voltage generating circuit for generating a second DC voltage equal to or above that of the first DC voltage, connections for connecting to an external energy absorbing circuit to be connected between a voltage output of the voltage generating circuit and ground potential, and a diode connection means between the first outlet port and the voltage output of the voltage generating circuit.

Other features are detailed in the dependent claims.

The present invention also provides a method of operating a power supply device comprising:

supplying DC power at a first DC voltage to first and second outlet ports of the power supply device for connection to a remote device via a cable connection, generating a voltage equal to or above that of the first DC voltage; and absorbing electric energy in an electric energy absorbing circuit connected between an output of the second DC voltage and a ground potential, and diverting current to the electric energy absorbing circuit if the voltage on the first outlet exceeds the second DC voltage.

The present invention will now be described with reference to the following schematic drawings.

DESCRIPTION OF ILLUSTRATIVE EMBODIMENTS

Figure 1A:
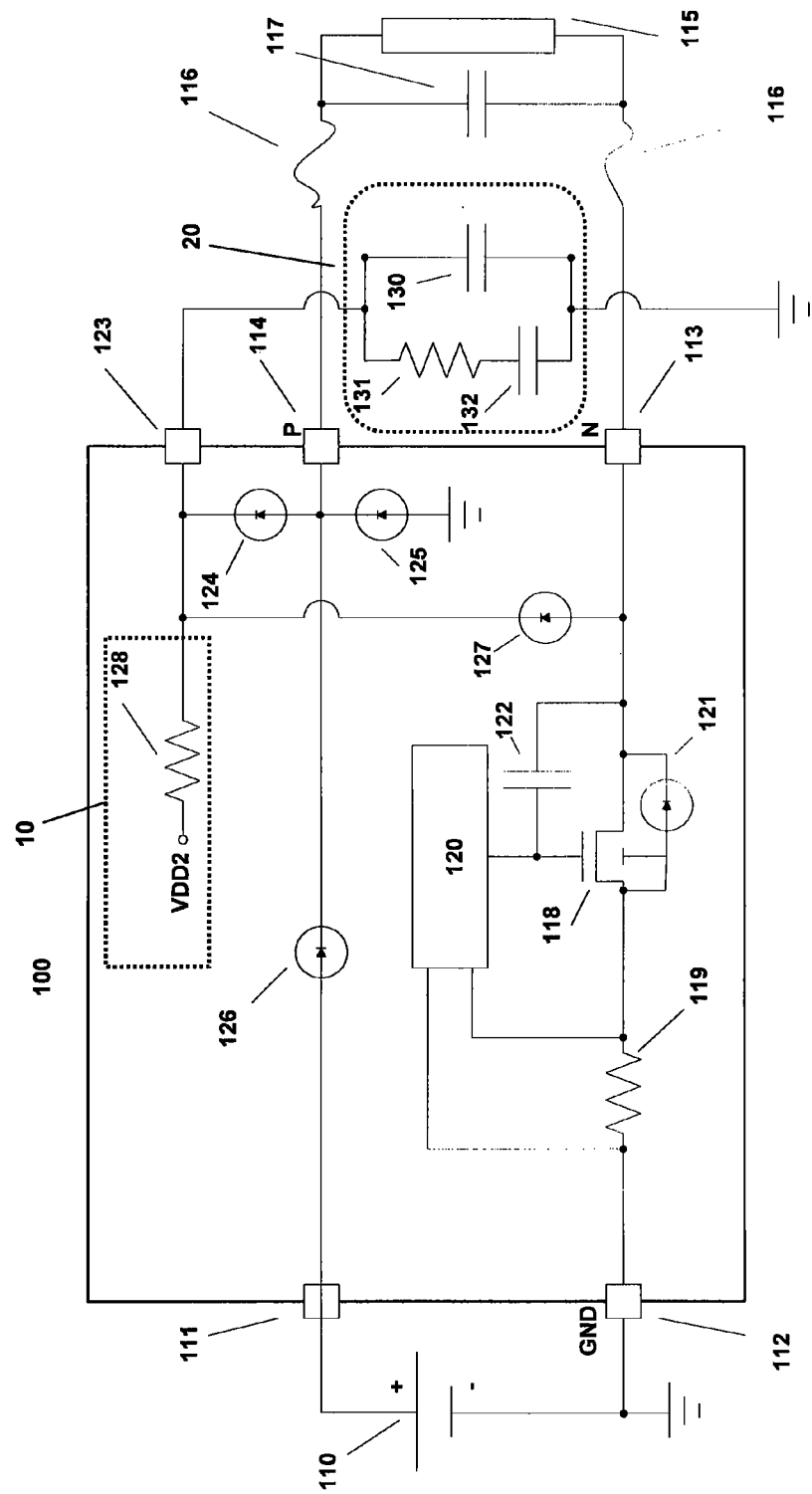
FIGS. 1a and 1b show schematic views of PSE circuits in accordance with embodiments of the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The present invention can find advantageous use in any power supply application, e.g. DC power supply over cables. The present invention will mainly be described with reference to providing power over a shared resource network of which an Ethernet network is only an example (Power over Ethernet or PoE). The topology of the network is not considered to be a limitation on the present invention, e.g. star, bus, token ring topologies, etc.

Figure 1B:
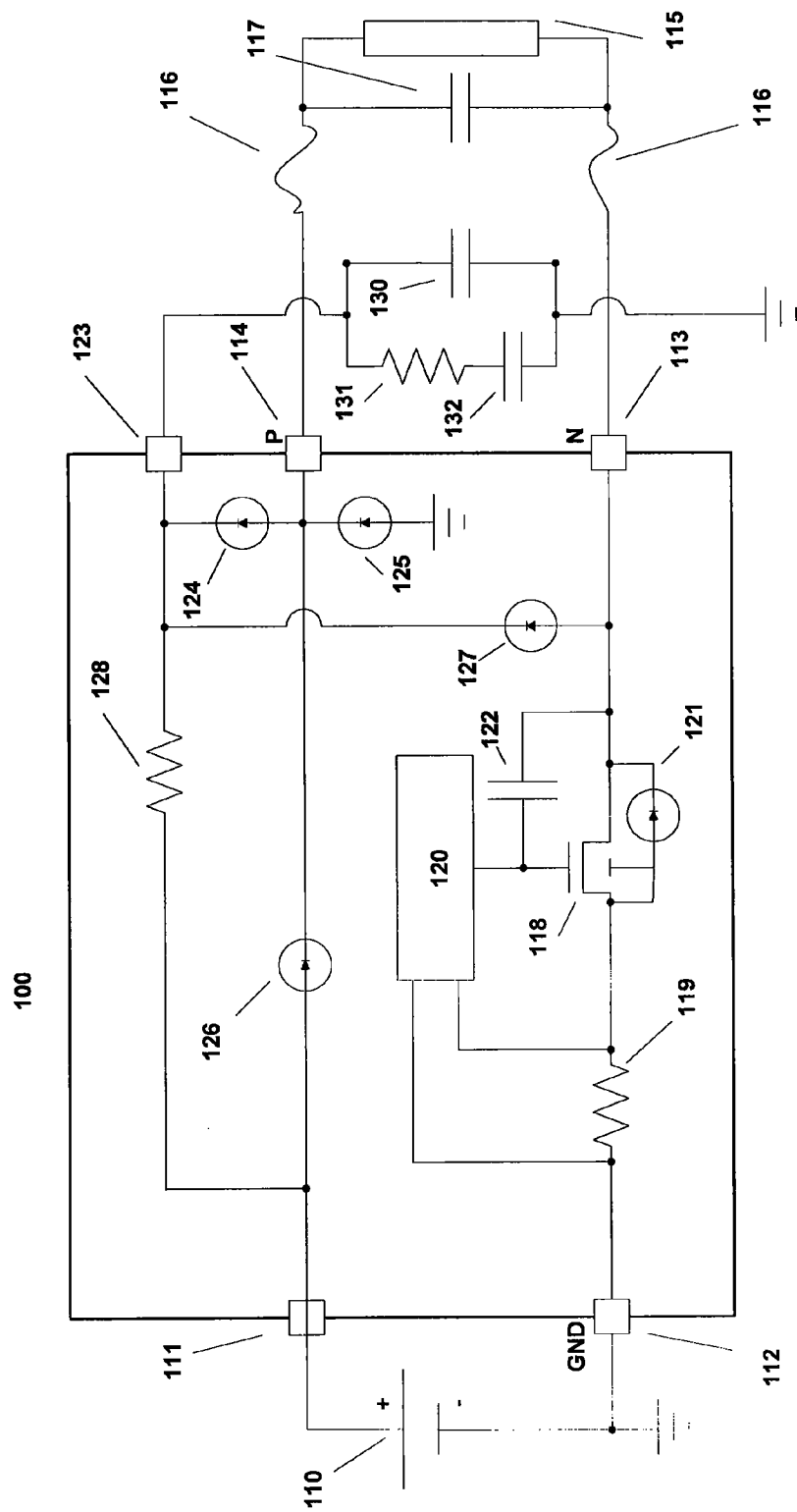

As seen on FIG. 1a or FIG. 1b, a PoE solution typically contains a Power Sourcing Equipment (PSE) 100 and one or more Powered Devices (PD) 115 linked by a cable 116 and appropriate connectors (not shown). The word "equipment" should be interpreted broadly. For example, the power sourcing equipment (PSE) can be a stand-alone device for attachment to a network or may be included in another device attached to the network, e.g. in network components such as hubs, switches, routers, wireless base stations, wireless outlets, wireless access points, printer servers, PBX's as well as in any other peripheral equipment such as data units, digital terminal equipment, wired or wireless telephones, computers, displays, projectors, printers, etc. The power sourcing equipment (PSE) may also be, or may be included in, an electronic component such as on an insertable card or board such as a Printed Circuit Board (PC) for insertion in any electronic device or as an Integrated Circuit. The electronic component may include an IC (see below), connectors, and passive components such as capacitors. A power supply may be provided from external components or devices, e.g. from the host device which is to receive the electronic component or may be integrated on the electronic component. The electronic component may also include voltage transformation devices, e.g. to receive a AC voltage from an external supply and to transform this to the required voltage with additional rectifier circuits and optionally smoothing circuits to generate the final DC voltage required by the PoE application. The power sourcing equipment (PSE) may also be implemented as an integrated circuit or an integrated circuit module. When the electronic component is an IC, the IC may include the components contained within the black rectangle in FIG. 1a or FIG. 1b. For example, the IC may include a mixed signal control section 120 and a power section. The power section includes a power switch 118 and a current sensing device 119. As shown in FIG. 1a or FIG. 1b, the sensing device 119 is a sense resistor but this does not limit the invention in any way, the current sensor could for instance be a Hall sensor not connected in series with the power switch 118. The power switch 118 can be implemented by any suitable power switching device, for example, by a MOSFET transistor, a bipolar transistor, a relay, (the power switch will preferentially be a power MOSFET (DMOS)) or a bipolar transistor integrated in the same semiconductor substrate as the control section 120. The power switch 118 controls the amount of current supplied to the load or Powered Device (PD) 115 based on information from the current sensing device 119. The IC will also include connections for coupling to a power supply. Optionally, the IC may include connections for coupling to the energy absorbing circuit 20 and the network cable. The IC may also include connections to the voltage booster circuit 10 or this circuit may be included within the IC. The IC may also include any of diodes 124, 125, 126, 127 or any combination of these.

The Powered Device (PD) can be any device attached to the network that needs to be powered, e.g. network components such as hubs, switches, routers, wireless base stations, wireless outlets, wireless access points, printer servers, PBX's as well as in any other peripheral equipment such as data units, digital terminal equipment, telephones, computers, displays, projectors, printers, battery chargers, docking stations, etc. The PD may also be, or may be included in, an electronic component such as on an insertable card or board such as a Printed Circuit Board (PC) for insertion in any electronic device. The PD may also be implemented as an integrated circuit or an integrated circuit module.

As an example, the PSE may supply power at a fixed voltage or in a range of voltages, e.g. up to 150 volt DC, typically 44 to 57 V DC, and at a power of tens of watts, such as at least 15 watt or at least 25 watt. A PD may operate at similar voltages and powers.

Returning to FIG. 1a or FIG. 1b, a parasitic capacitor 117 represents schematically the equivalent capacitor of the cable 116, the PD 115 and the connectors (not shown). A typical PSE device (whether implemented as an IC or not) includes a mixed signal control section 120 and a power section. The power section includes a power switch 118 and a current sensing device 119. As shown in FIG. 1a or FIG. 1b, the sensing device 119 is a sense resistor but this does not limit the invention in any way. As indicated above the current sensor could for instance be a Hall sensor not connected in series with the power switch 118. The power switch 118 can be implemented by any suitable power switching device, for example, by a MOSFET transistor, a bipolar transistor, a relay (if the PSE device is integrated, the power switch will preferentially be a power MOSFET (DMOS)), or a bipolar transistor integrated in the same semiconductor substrate as the control section 120. The power switch 118 controls the amount of current supplied to the load or PD 115 based on information from the current sensing device 119.

The cable 116 that connects the PSE to the PD can be as long as required, e.g. 200 m. Even with a low or moderate specific capacitance per unit length of cable, such a cable can accumulate a substantial charge that makes CDE an even more challenging problem.

At the instant the cable is connected to the PSE, the cable will discharge part or most of its electric charge to the port. The discharge current to the port can be as high as 10 A.

The present invention makes it possible to absorb cable charge in an electric energy absorbing section 20. The electric energy absorbing section 20 may include a short term energy absorbing means, e.g. for voltage fluctuations above 500 kHz or above 1 MHz and a longer term energy absorbing means for fluctuations at a lower frequency, e.g. below 1 MHz or below 500 kHZ. The electric energy absorbing section 20, as shown in FIG. 1a or FIG. 1b, includes a pre-charged capacitor 132, e.g. an electrolytic capacitor with a capacitance of 10 μF and presenting a series parasitic resistor 131 (e.g. the equivalent series resistor or FSR), in parallel with a capacitor 130, e.g. a ceramic capacitor with a capacitance of 470 nF. The capacitor 132 will mainly help against slowly varying perturbations and the capacitor 130 against fast varying perturbations. Hence the capacitor 132 is a longer term energy absorbing means and capacitor 130 is a short term energy absorbing means. If, the PSE 100 is an integrated circuit, capacitors 130 and 132 are connected to the PSE 100 through a port 123. The electric energy absorbing section 20 may be formed of any suitable components, e.g. passive components such as capacitors and resistors and/or active components such as transistors.

A further voltage supplying circuit may be provided which provides a voltage VDD2 which may be the same as VDD or higher. If the voltage VDD2 is higher then the supply voltage VDD, the further voltage supplying circuit is then a booster circuit 10 that is provided to supply a DC voltage VDD2 (see FIG. 1a) higher than the DC voltage VDD of the PoE supply 110, i.e. VDD2 is VDD plus a difference voltage. In the following the invention will be described with reference to the further voltage supplying circuit that is a booster voltage circuit 10, but the present invention and the attached claims are not limited thereto. In the case that a booster voltage supply circuit 10 is used, VDD2 can be in the region of volts, e.g. 3V, higher than VDD. VDD2 can for instance be generated with a charge pump. VDD2 is used to pre-charge the capacitors 132 and 130 to a voltage higher than VDD. The VDD2 voltage output of the booster voltage circuit 10 is connected to port 123. The energy absorbing circuit 20 is connected between port 123 and ground. VDD2 being higher than or equal to VDD, the diode 124 is reverse biased and no current will flow through diode 124 even if the voltage VDD fluctuates a little, e.g. supply voltage fluctuations, i.e. the fluctuations should be less than the difference voltage between VDD2 and VDD. The diode 124 forms a diode connection means between the output port P 114 on one side and the energy absorbing circuit 20 and the voltage VDD2 on the other side. The diode connection means can be formed by any suitable circuit or device which allows current to flow in substantially only one direction. The diode connection means can include any suitable passive, e.g. a diode, and or active, e.g. transistor, devices.

Alternatively, the diode 124 can be connected directly between the port P 114 and, through the port 111, the PoE supply 110. In that case however over-voltage on port P will forward bias the diode 124 and force current into the supply 110. This is not always acceptable. See FIG. 1b. A current limiter such as a resistor 128 or any other suitable current limiting component or circuit, connected in series between the diode 124 and the DC voltage supply 110, has an impedance, e.g. resistance that limits the current at start-up (when the capacitors 130 and 132 are discharged), e.g. with a value of 10 kΩ or as required. It also helps to limit the current fluctuations seen by either VDD2 or VDD during a cable discharge event.

Let us assume that a charged cable 116 is connected to ports P (114) and N (113) of the PSE device 100 of FIG. 1a. The high voltage (e.g. up to several kV) caused by stored charge in the cable at node P will forward bias the diode 124 and the discharge current will flow through diode 124 to node 123 and be absorbed in the energy absorbing section, e.g. by capacitors 132 and 130. The capacitance of capacitors 130 and 132 is chosen to limit the cable discharge transient on the port 123 to an acceptable level, for instance no more than 10V away from VDD.

By pre-charging the capacitors 130 and 132 up to e.g. 51V the diode 124 is in reverse bias when the POE port is in normal operation, i.e. operating at VDD=48V.

With these operation conditions for VDD and VDD2, as soon as there is a 3V over-voltage on the P-pin 114, the diode 124 goes in forward operation and the CDE charge is absorbed in the capacitors 130, 132. Similarly the N-pin 113 is protected from excessive over-voltage by diode 127 to the port 123. Furthermore, if at start up the switch 118 is open and a CDE causes a rapid increase of the voltage on node 113, the drain gate capacitor 122 of the power MOSFET 118 will pull up the gate of transistor 118, and transistor 118 will start conducting allowing the discharge to be routed to ground. Contrary to what is disclosed in US 20060173581A1, the activation of the switch is caused by the event itself and does not require an intermediary digital circuit.

If the CDE fluctuations may not be seen by the DC power supply 110, the present invention may be adapted by providing a second DC voltage VDD2>=VDD. VDD2 should be higher or equal to VDD, otherwise, diode 124 would be forward biased and energy would be spilled continuously. VDD2 could be a buffered version of VDD or VDD2 could be generated for instance by a booster circuit 10, e.g. a charge pump.

During a CDE event, the potential on ports 114 and 113 will fluctuate in a more complex way than is the case during a typical electrostatic discharge. The potential on any of the ports 113 and 114 can not only increase during the CDE, it can also decrease, i.e. the CDE waveform is oscillating. Negative peaks on port P are absorbed by the diodes 125 and 126 or in other words if the voltage on port P decreases substantially or especially excessively below its value before the discharge, part of the discharge will flow through diode 125 to ground, the diode 126 remains forward biased and allows the supply to absorb part of the discharge. In the voltage on port N 113 decreases below ground, the diode 121 will be forward biased and the discharge will be done to the GND through diode 121. If the PSE 100 is an integrated circuit, the diode 121 can be the parasitic diode associated with the switch 118, e.g. a power MOSFET.

Figure 2:
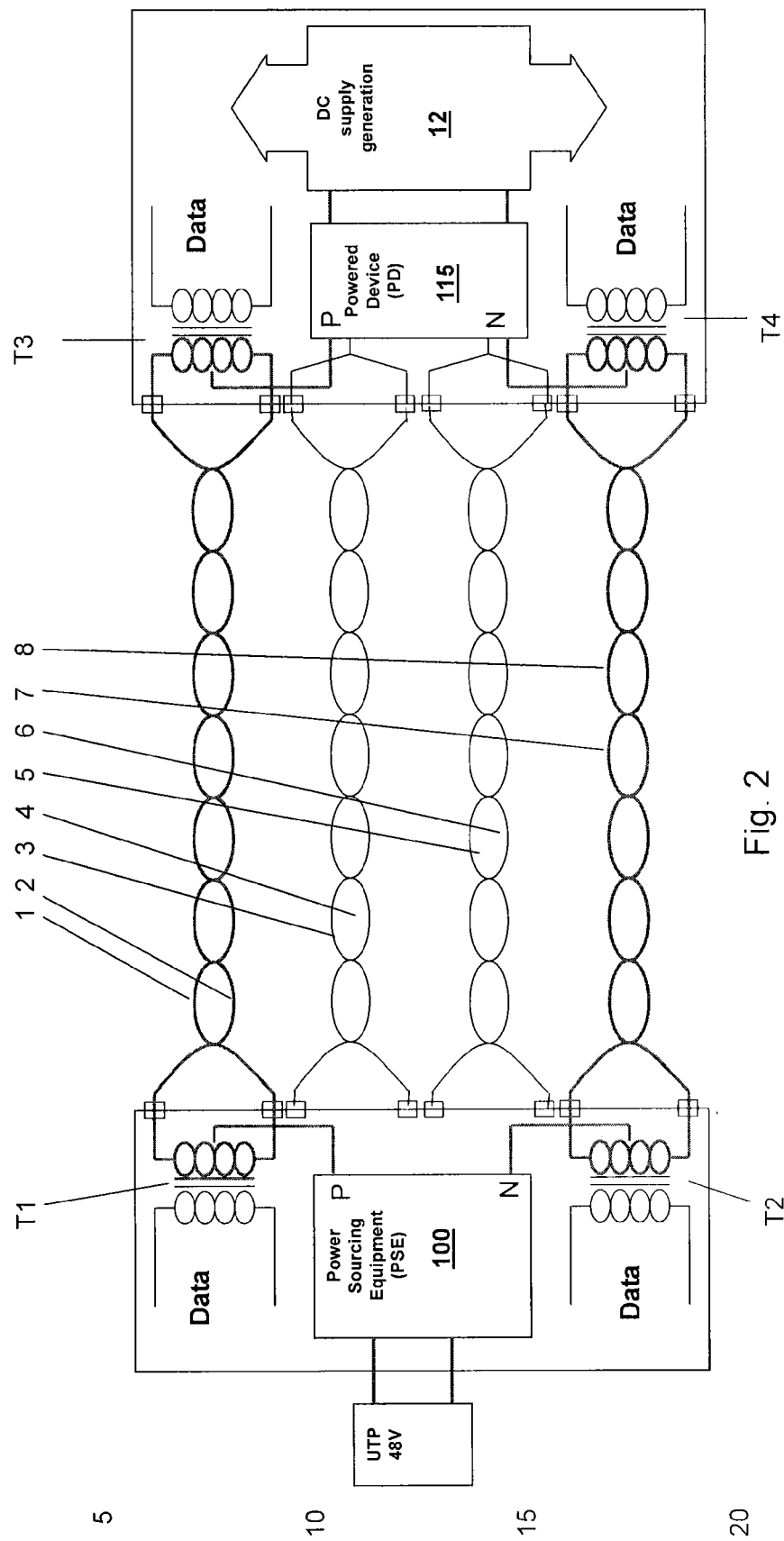
FIG. 2 shows a PSE in accordance with an embodiment of the present invention in a network arrangement.

The present invention may be applied to power supply devices having cable connections with power cable wiring or with power being supplied over the same wires as data signals, e.g. digital or analog signals. For example, there are indeed 6 to 8 wires for each Ethernet cable and the PSE (or PD) are connected to the Ethernet cable through at least two wires (e.g. 4 in the case of Gigabit Ethernet). As shown in FIG. 2 the Ethernet cable has 8 wires 1-8. Without using PoE (Power over Ethernet) only 4 of them are used. For Gigabit Ethernet all 8 wires are used, e.g. 2 data channels in parallel plus power supply. For PoE, the present invention includes either:

A. Supplying the power on the data channel, e.g. via a transformer.
B. Supplying the power on the dedicated wires separate from the data wires,
or a combination of the two.

All the above implementations may be made available via the PSE device, e.g. via the same chipset (PSE-PD).

As explained with respect to FIG. 1, over-voltage protection according to the present invention concerns supply through two ports (N and P) that correspond to the exit/entry points of the PSE/PD device. However per port, more than one wire may be used. As shown in FIG. 2, a PSE 100 in accordance with embodiments of the present invention is shown connected via cable wiring 1-8, e.g. a Gigabit Ethernet or Fast Ethernet connection, to a powered device 115. The PSE 100 is the same as the one described with respect to FIG. 1*a* or FIG. 1*b*. The power signals (outputs of pin P and N) are used as a common mode signals. Data signals are superposed on the common mode signals through transistors T1 and T2. Data signals such as frames Ethernet data are injected into the wirings 1, 2 and 7, 8 via transformers T1 and T2, respectively.

The present invention is not limited to providing power along only two wires. However, alternatively the transformers T1 and T2 may be biased by the PSE 100 with DC voltages, e.g. the transformer T1 to a positive voltage and the transformer T2 to ground or a negative voltage. The power is then supplied over the same wires as are used for data transmission. This power is extracted in the powered device from transformers T3 and T4 and smoothed if necessary. The extracted power can be used to power any device local to the PD 115 or can be transmitted further, e.g. via a distribution network 12.

The protection described with respect to all the embodiments of the present invention is efficient not only for CDE but also for an overvoltage that can occur on pin P and N during a disconnection of the cable. In that case, the overvoltage is induced by parasitic inductances instead of parasitic capacitances.

The invention claimed is:

1. A method of operating a power supply device, comprising:
supplying DC power at a first DC voltage to first and second outlet ports of the power supply device,
generating, using a DC voltage supply, a second DC voltage equal to, or greater than, the first DC voltage, wherein the second DC voltage is supplied to an energy absorbing circuit,
diverting current from the first outlet port to the energy absorbing circuit if an instantaneous voltage at the first outlet port exceeds the second DC voltage, and
absorbing energy from the current in the energy absorbing circuit.

2. A power supply device, comprising:
first and second DC voltage supply input ports, wherein, when coupled to a first DC voltage supply, the first DC voltage supply input port has a first DC voltage;
first and second outlet ports, wherein the first DC voltage supply input port is coupled to the first outlet port;
a power section coupled between the second DC voltage supply input port and the second outlet port;
a second DC voltage supply providing during operation a second DC voltage at least equal to the first DC voltage;
an energy absorbing circuit output port coupled to the second DC voltage supply; and
a diode having an anode coupled to the first outlet port, and a cathode coupled to the second DC voltage supply, wherein the diode is configured to divert current from the first outlet port to the energy absorbing circuit.

3. The power supply device according to claim 1, further comprising a voltage boosting circuit configured to generate the second DC voltage.

4. The power supply device of claim 1, further comprising a mixed signal control section coupled to the power section.

5. The power supply device of claim 1, wherein the power section includes a power switch coupled to the second DC voltage supply input port, and a current sensing device configured to sense through the power switch.

6. The power supply device of claim 5, further comprising a second diode coupled in parallel with the power switch, having an anode coupled to the current sensing device and a cathode coupled to the second outlet port.

7. The power supply device of claim 5, further comprising a capacitor coupled between a switch control terminal of the power switch and the second outlet port.

8. The power supply device of claim 5, wherein the power switch is configured to control the amount of current supplied to toy the first and second outlet ports based on an output from the current sensing device.

9. The power supply device of claim 1, further comprising a second diode coupled between the first outlet port and ground.

10. The power supply device of claim 1, further comprising a second diode coupled between the output of the second DC voltage supply and the second outlet port.

11. The power supply device of claim 2, further comprising a second diode having an anode coupled to the second DC voltage supply input port and a cathode coupled to the first outlet port.

12. A network component comprising the power supply device according to claim 1.

13. The power supply device of claim 1, further comprising:
   a first DC voltage supply coupled to the first and second DC voltage supply input ports; and
   an energy absorbing circuit coupled between ground and the energy absorbing circuit output port.

14. The power supply device of claim 13, wherein the energy absorbing circuit includes a shorter term energy absorbing device and a longer term energy absorbing device.

15. The power supply device of claim 14, wherein at least one of the shorter term energy absorbing device and the longer term energy absorbing device includes a capacitor.

16. The power supply device of claim 15, wherein the shorter term energy absorbing device includes a first capacitor and the longer term absorbing device includes a second capacitor, and the first and second capacitors are coupled in parallel.

* * * * *

UNITED STATES PATENT AND TRADEMARK OFFICE
CERTIFICATE OF CORRECTION

PATENT NO. : 8,582,271 B2  
APPLICATION NO. : 11/847979  
DATED : November 12, 2013  
INVENTOR(S) : Bertin et al.

Page 1 of 1

It is certified that error appears in the above-identified patent and that said Letters Patent is hereby corrected as shown below:

In the Claims

Column 8, Line 45, replace "claim 1" with --claim 2--.

Column 8, Line 48, replace "claim 1" with --claim 2--.

Column 8, Line 50, replace "claim 1" with --claim 2--.

Column 8, Line 53, replace "sense through" with --sense current through--.

Column 8, Line 63, replace "to toy the first" with --to the first--.

Column 8, Line 65, replace "claim 1" with --claim 2--.

Column 9, Line 1, replace "claim 1" with --claim 2--.

Column 9, Line 9, replace "claim 1" with --claim 2--.

Column 9, Line 10, replace "claim 1" with --claim 2--.

Signed and Sealed this  
Twenty-seventh Day of May, 2014

Michelle K. Lee  
*Deputy Director of the United States Patent and Trademark Office*